(12) United States Patent
Azzarelli et al.

(10) Patent No.: US 6,437,737 B1
(45) Date of Patent: Aug. 20, 2002

(54) ANTENNA DATA COMPRESSION USING MULTI-DIPOLE ANTENNA

(75) Inventors: Teodoro Azzarelli, Los Angeles; Paul Kwon, Chatsworth, both of CA (US)

(73) Assignee: Science and Applied Technology, Inc., San Diego, CA (US)

( * ) Notice: Subject to any disclaimer, the term of this patent is extended or adjusted under 35 U.S.C. 154(b) by 0 days.

(21) Appl. No.: 09/491,367

(22) Filed: Jan. 26, 2000

Related U.S. Application Data

(60) Provisional application No. 60/129,715, filed on Apr. 16, 1999.

(51) Int. Cl.[7] .................................................. H01Q 3/00
(52) U.S. Cl. ....................................................... 342/360
(58) Field of Search ................................ 342/149, 360, 342/378, 437, 442

(56) References Cited

U.S. PATENT DOCUMENTS

| | | | |
|---|---|---|---|
| 4,573,208 A | * | 2/1986 | Jacobs et al. .................. 455/71 |
| 5,296,863 A | * | 3/1994 | Sezai .......................... 342/371 |
| 5,422,637 A | * | 6/1995 | Sezai ........................... 342/13 |
| 5,485,162 A | * | 1/1996 | Sezai .......................... 342/378 |

\* cited by examiner

Primary Examiner—Dao Phan
(74) Attorney, Agent, or Firm—Brooks & Fillbach; Michael Blaine Brooks; Andrew Steven Naglestad

(57) ABSTRACT

Data compression method, system, and program code for compressing antenna pattern data generated by measuring the complex voltage derived from the interaction of a RF waveform and a sensing element are disclosed. The antenna pattern data are modeled with a plurality of infinitesimal antenna elements, each element defined in terms of a distinct position, orientation, and polarization. An analytical expression for the interaction between the plurality of infinitesimal antenna elements and an impinging waveform yields a plurality of expressions for a theoretical voltage. The plurality of infinitesimal antenna elements constitute a mathematical basis set from which a weighted linear combination is constructed. The value of the weights are determined by equating the complex voltage representing the antenna pattern data with the theoretical voltage representing the plurality of weighted infinitesimal antenna elements. In turn, the weights comprise an encoded representation of the antenna pattern data from which the antenna pattern data may be reconstructed or decompressed.

22 Claims, 6 Drawing Sheets

ANTENNA DATA COMPRESSION USING MULTI-DIPOLE ANTENNA

CROSS-REFERENCE TO RELATED APPLICATION

This application claims the benefit of Provisional Patent Application Ser. No. 60/129,715 filed Apr. 16, 1999.

FIELD AND BACKGROUND OF THE INVENTION

The present invention relates to the compression of antenna voltage data acquired with a receiving element of an antenna system. More particularly, the present invention relates to a data compression method for determining a set of complex weights which, in cooperation with the position and orientation of one or more idealized linear dipole antennas, permit voltage data measured with a receiving antenna to be represented with minimal loss of accuracy using minimal computer storage memory.

In general, data compression refers to the process of reducing the amount of data required to represent a given quantity of information with sufficient practical accuracy. A practical problem solved by data compression is efficient image transmission where the underlying objective is to remove redundant data. The reduced data may thereby permit more efficient manipulation, storage, and transmission of information. At a later stage in the handling of this information, the compressed image may be decompressed to reconstruct the original image or an approximation of it. Image compression techniques play a crucial role in numerous applications including televideo conferencing, remote sensing, document and medical imaging, facsimile transmission, among others.

There exist a number of error-free compression techniques with which one may exactly reconstruct the compressed image. These techniques typically provide compression ratios on the order of from 2:1 to 10:1. Lossy encoding approaches on the other hand achieve increased compression ratios but result, by definition, in some degradation of the reconstructed image. Depending on the data, a minimal tradeoff in accuracy may yield significant increases in compression ratios.

Antenna data compression refers to the compression of complex voltage data empirically derived using an antenna and source of RF radiation. The voltage data are collected in a controlled environment and are representative of the voltages one would expect to measure in a field application using the same or a substantially similar antenna. The data are a record of the phase and amplitude of the complex voltages generated at an antenna array when irradiated with an emitter of known power, frequency and polarization. The relative orientation of the array and emitter are varied to acquire a sampling of data representative of the field of view of the antenna. Preferably, the data are characterized by a high signal-to-noise ratio at each of one or more distinct frequencies falling within a predetermined bandwidth. The voltage data are essential in passive, direction-finding systems that are used by ground-based radar and airborne vehicles. Angles-of-arrival are two body-relative polar angles representing the direction of the incoming wave. In the absence of a physical model, the voltage data are required for angle-of-arrival determinations of incoming electromagnetic signals when using search techniques relying on comparisons between measured and reference voltages.

In the present application specifically, the compression of the voltage data refers to the process by which the voltage data are mathematically modeled for later reconstruction in a fast and efficient manner using minimal computer storage memory. With no compression, the amount of memory required to adequately represent the reference voltage data with sufficient accuracy and resolution exceeds the practical memory and data transfer capacity of many volumetrically constrained applications such as with modern missiles and highly portable systems.

In missile and sensor pod applications, the problem of compression is exasperated by the complexity of the voltage data acquired by means of conformal antenna elements. Individual antenna elements are commonly mounted to, or in proximity of, the metallic or dielectric body of a missile, sensor pod or sensor suite housing. The presence of the body may partially shadow the antenna elements in addition to perturbing the field pattern in ways that are difficult to represent and predict with practical accuracy. As a result, both the phase and amplitude of antenna data may deviate substantially from those of simple models of sub-element antennas, such as the infinitesimal dipole model.

A second problem associated with voltage data acquired from antennas in missile applications arises from the fact that it is often necessary to place antenna elements within the constraints of special orientations as required for practical configurations with non-planar surfaces. The antenna elements are typically made to conform to the cylindrical or conical shape of the missile or sensor housing, giving rise to an array of elements having a diversity of polarization orientations. In the previous generation of missiles, arrays were comprised of receiving elements with substantially identical polarization angles resulting in an almost complete absence of polarization diversity. Each of the antenna elements possessed an equivalent polarization mismatch with the incoming wave giving rise to interferometric measurements that are a function of the difference in path length traveled by the incoming wave-front as it impinges upon the particular antenna element pair alone. The phase difference between pairs of antennas in a polarization-diverse array includes additional contributions because of the polarization mismatch between receiving antennas produced by the mounting orientations. The voltage received at each antenna is therefore a relatively complicated function of the angles of arrival and of the polarization of the incoming wave.

There are currently numerous transforms with which one may represent signal data. Among the most notable and commonly applied are the Fourier transform or Discrete Fast Fourier Transform (DFFT), as well as the Cosine transform. These transforms permit one to efficiently reconstruct a given signal exactly where: (1) the original signal is band-limited and (2) the data are acquired at a rate sufficiently high to satisfy the Nyquist sampling criterion. Where the signal data possess high frequency content, a large number of DFFT expansion terms must be retained in order to maintain the integrity of the original data. For purposes of antenna data compression, the Fourier transform is unsuitable for the reason that the voltage data are high frequency data. In the present application, for a typical quality, the Fourier and Cosine transforms provide unacceptably low compression ratios of four to one over the original data.

SUMMARY OF THE INVENTION

The primary object of the present invention is to provide a method for accurately representing the voltage data signals of an antenna system comprising a plurality of RF sensing elements with minimal data and minimal loss of accuracy. The complex voltage data signals are represented by the amplitude and phase of the received RF signal as measured by the plurality of sensing elements having differing and substantially known orientations of polarization. The voltage is primarily dependent on the two angles-of-arrival, two polarization parameters specifying the polarization of the incoming electromagnetic wave, and the frequency of the received wave.

This and other objects are achieved by representing each RF sensing element of an array of elements as the superposition of a plurality of "sub-element antennas" with variable positions and orientations. The sub-element antennas are not physical antennas, but are mathematical representations of infinitesimal antennas distributed in free space. The sub-element antennas are preferably infinitesimal linear dipoles, but may be generalized to represent elements of elliptical polarization.

As physically realizable elements, the RF sensing elements are used in airborne vehicles to receive RF radiation propagating from one or more emitters. These receiving elements, when working in cooperation, comprise an array for performing direction-finding. Each receiving element has associated with it a distribution of sub-element antennas for modeling the voltage measured by the receiving element. Each of the sub-element antennas, or dipoles, is assigned a position in proximity to the associated receiving element. Each dipole is further assigned an initial polarization orientation preferably patterned after the receiving element. A hitherto unknown multiplying factor is then determined for each dipole. The factors constitute complex weight which, when determined, yield an expression for the voltage of a superposition of weighted dipoles that substantially and accurately represents the voltage detected by the receiving element for a variety of RF signal directions, frequencies, and polarizations.

The complex weights may be determined for each of the dipoles in accordance with the teachings of this invention. Below is described a method for solving for these weights in terms of the voltage data from which a system of linear equations is composed. The system of equations relates the voltage of the distribution of dipoles of unknown weights with the measured voltages acquired by means of actual, individual, receiving elements, each at discrete angles-of-arrival, frequencies, and polarizations. The system of equations is then operationally inverted and Maximum Likelihood (ML) or least squares techniques applied to determine the weights.

Given a distribution of weighted dipoles of known position and weighting, a reference voltage at a particular receiving element may be analytically reconstructed for an incoming electromagnetic wave (for arbitrary angles-of-arrival and polarization) from the sum of the voltages of the dipoles of the corresponding distribution. The accuracy of the reconstructed voltage may be reproduced with arbitrary precision for angles-of-arrival and frequencies that lie within the field of view and bandwidth as determined by the measured data. For a comparable loss of fidelity, the amount of data necessary to represent the distribution of dipoles is substantially smaller than that needed to store either the original voltage data or the data as compressed using other transformation techniques.

Referring now to FIGS. 1 and 2, where like reference numerals indicate like elements throughout the several views, the conformal antenna element array configuration used in deriving the sub-element antennas for data compression is shown. FIG. 1 illustrates the orientation and mounting of a RF antenna array 111 used to explain the present invention. An individual RF sensing element 101, when working in cooperation with other similar elements mounted on a surface 102, becomes an integral part of a RF antenna array 111. The mounting surface 102 illustrated is the shape of a cone with a rounded apex and could also be the shape of a right cone, a cylinder or any other convex or even concave surface. A principal axis 103 passes through a point at the center of the conical base of 102 and a point at the tip of the rounded apex. The antenna array 111 forms a ring around the principal axis 103. Coinciding with the principal axis 103 is the positive z-axis of a Cartesian coordinate system with its origin located at the point of intersection of the principal axis 103 and the plane containing the phase centers of the antenna elements comprising the antenna array 111. With the principal axis defining a forward horizontal directional axis, the y-axis 104 is a down directional axis and the x-axis 105 is a "to the right" directional axis.

An individual sensing element 114 possesses a polarization orientation given by vector 112, which is in the plane created by the principal axis 103 and the phase center of the element 114. The angle between vector 112 and the plane including the axes 104 and 105 is the tilt angle 113 given by τ, or tau. The tilt angle 113 is substantially the same value for each of the sensing elements comprising the array 111.

A vector directly from the center of the RF antenna array 111 to the RF emitting source 106 is designated the line-of-sight vector 107 and is the directional vector of the RF emitting source 106 relative to the RF antenna array 111. The angle created by the sides 103 and 107 is 109. The angle 109 is the first of two angles-of-arrival, θ, or theta.

Referring to FIG. 2, a view of the conformal antenna array 111 configuration is shown looking down the principal axis 103. In this configuration, a number of substantially similar, linearly polarized, antenna elements are located about a circular ring. The position of each antenna is defined in the plane containing the antenna elements by polar angle α, or alpha, 208 as shown in FIG. 2. The angle created by the body-fixed, "to the right" directional axis reference 105 and the line-of-sight vector projection 210 is the second angle-of-arrival 211, ϕ, or phi.

The instantaneous electrical field of the incoming wave from a RF emitting source 106 contained in a plane perpendicular to the direction of the incoming wave is $\bar{E}$. In an arbitrary orthonormal coordinate system given by the triad of unit vectors $\hat{\xi}$, $\hat{\eta}$, and $\hat{\zeta}$, the electrical field of an incoming plane wave having emitter polarization angles γ, or gamma, and δ, or delta, propagating in the ζ direction is expressed by $$\bar{E} = E_\xi \cos(\omega t)\hat{\xi} + E_\eta \sin(\omega t + \delta)\hat{\eta}, \quad [1]$$

where δ is the phase by which the η-component leads the ξ-component, ω, or omega, is the oscillatory frequency of the electrical field and the angle γ describes the relative values of $E_\xi$ and $E_\eta$ as follows:

$$\gamma = \arctan(E_\eta/E_\xi) \text{ for } 90 \geq \gamma \geq 0 \text{ degrees}. \quad [2]$$

The polarization of a receiving element, by definition, is the polarization of a wave radiated by the antenna in a given direction in the far field. In an arbitrary reference frame, the polarization of a wave emitted by such an antenna propagating in the ζ direction is given by $$\hat{p}_R = \cos\gamma_R \hat{\xi} + \sin\gamma_R \exp(j\delta_R)\hat{\eta} \quad [3]$$

While the polarization state variables $\delta_R$ and $\gamma_R$ completely define the polarization of the antenna in a given direction, they generally vary as a function of the particular ζ direction. Where reference is made to the polarization of an antenna without specifying the angular dependence, the polarization of a receiving antenna is understood to be the polarization of the antenna in the direction of the main beam.

The reference voltage is a function of the two states of polarization given by two pairs of angles, $(\gamma, \delta)$ and $(\gamma_R, \delta_R)$, as well as the direction of propagation of the incoming wave with respect to the orientation of the receiving element. The formulation of the voltage begins with the representation of the polarization of an elliptically polarized sub-element antenna located at the origin of the $\xi_R$-$\eta_R$-$\zeta_R$ coordinate system:

$$\hat{p}_R = \cos \gamma_R \hat{\xi}_R + \sin \gamma_R \exp(j\delta_R)\hat{\eta}_R, \quad [4]$$

where the polarization vector lies in the plane perpendicular to the vector, $\hat{\zeta}_R$. The $\zeta_R$-axis then coincides with the direction that yields maximal power when the incoming wave has the same polarization as the receiving antenna in that same direction. In the $\xi_R$-$\eta_R$-$\zeta_R$ coordinate system, the vector $\hat{\zeta}$ is defined in the body-fixed coordinate system of the array mounting 102 by the angles, $\theta = \theta_R$ and $\phi = \phi_R$. The representation of the remaining antennas is identical, except for the rotation of the angular position and polarization orientation about the principal axis 103 of the array mounting 102.

The open circuit voltage, $V_{OC}$, at a particular sensing element, is given by the inner product of the complex conjugate of the polarization state vector, which characterizes the state of the receiving antenna, and the electric field. The open circuit voltage is then given by $$V_{OC} = \hat{p}^*_R \cdot E. \quad [5]$$

Neglecting the field magnitude and the harmonic time dependence, the instantaneous complex voltage measured by an element at angular position $\alpha$ is proportional to voltage, $v(\alpha)$, and may be expressed in the form:

$$v(\alpha) = [A\cos(\phi - \phi_R - \alpha) + B\sin(\phi - \phi_R - \alpha) + Z] \times \quad [6]$$
$$\exp\left[-j\frac{2\pi R}{\lambda}(\sin\theta\cos(\phi - \alpha) + z\cos(\theta))\right],$$

where R is the radius of the surface of curvature 102, $\lambda$ is the wavelength of the received electromagnetic signal, and the following substitutions are made:

$$A = -[\cos \gamma \cos \gamma_R \cos \theta \cos \theta_R - \sin \gamma \exp(j\delta)\sin \gamma_R \exp(-j\delta_R)] \quad [7]$$

$$B = -[\sin \gamma \cos \gamma_R \cos \theta \cos \theta_R \exp(j\delta) + \cos \gamma \sin \gamma_R \cos \theta \exp(-j\delta_R)] \quad [8]$$

$$Z = -\cos \gamma \cos \gamma_R \sin \theta \sin \theta_R. \quad [9]$$

A special case of interest is that of the linearly polarized dipole antenna with a tilt angle, $\theta_R = \tau$. Consider the dipole located on the surface 102 at the angular position $\alpha = 0$ with $\phi_R = 0$. The polarization state variables are given by $\gamma_R = \pi$ and $\delta_R = 0$, yielding coefficients A, B, and Z given as:

$$A = \cos \gamma \cos \theta \cos \tau \quad [10]$$

$$B = \sin \gamma \cos \tau \exp(j\delta) \quad [11]$$

$$Z = \cos \gamma \sin \theta \sin \tau. \quad [12]$$

The coefficients A, B, and Z are functions of the hitherto unknown angles-of-arrival as well and the polarization of the emitter and receiver.

The voltage represented by Equations 6 and 10 through 12 above is that of a single infinitesimal dipole and can be used to describe many electrically-small antennas in free space. However, when antennas are placed on a metallic or dielectric surface, or are partially shadowed by the mounting body on which they are attached, the voltages may vary substantially from predictions based upon the mathematical model of a single dipole.

Below is described a new process involving representative antenna field patterns, specifically a method by which voltage data may be compactly encoded and stored in memory prior to its decompression and application in angle-of-arrival determination as one of its immediate applications.

Voltage of Distribution of Dipole Antennas

A generalized model of the antenna field pattern may be obtained by representing the voltage received at each receiving element in terms of the voltages produced by a weighted distribution of infinitesimal dipoles such as those described in Equation 6. The description will be limited to the special case of the tilted linear dipoles where A, B, and Z are given by Equations 10 through 12. The generalized voltage of a group of such dipoles distributed about three positional degrees of freedom, $\alpha$, R, and z, and the single polarization tilt degree of freedom, $\tau$, is given as follows:

$$V(\theta, \phi, \gamma, \delta, \lambda) = \int\int\int [\cos\gamma\cos\theta\cos(\phi - \alpha) + \quad [13]$$
$$\sin\gamma\exp(j\delta)\sin(\phi - \alpha)] \times \exp\left[j\frac{2\pi}{\lambda}[R\sin\theta\cos(\phi - \alpha) + z\cos\theta]\right]d\alpha dRdz \int w(\alpha, R, z, \tau)\cos\tau d\tau +$$
$$\cos\gamma\sin\theta \int\int\int \exp\left[j\frac{2\pi}{\lambda}[R\sin\theta\cos(\phi - \alpha) + z\cos\theta]\right]d\alpha dRdz \int w(\alpha, R, z, \tau)\sin(\tau)d\tau.$$

By defining two new weighting functions, given by $$g(\alpha, R, z) = \int w(\alpha, R, z, \tau)\cos \tau d\tau \quad [14]$$

$$h(\alpha, R, z) = \int w(\alpha, R, z, \tau)\sin \tau d\tau, \quad [15]$$

the voltage of Equation 13 may be expressed as $$V(\theta, \phi, \gamma, \delta, \lambda) = \int\int\int g(\alpha, R, z)[\cos\gamma\cos\theta\cos(\phi - \alpha) + \quad [16]$$
$$\sin\gamma\exp(j\delta)\sin(\phi - \alpha)] \times \exp\left[j\frac{2\pi}{\lambda}[R\sin\theta\cos(\phi - \alpha) + z\cos\theta]\right]d\alpha dRdz +$$
$$\cos\gamma\sin\theta \int\int\int h(\alpha, R, z)\exp\left[j\frac{2\pi}{\lambda}[R\sin\theta\cos(\phi - \alpha) + z\cos\theta]\right]d\alpha dRdz.$$

If one further presumes that each of the dipoles of the distribution are restricted to discrete values for the position, the voltage is expressed as the finite triple sum:

$$V(\theta, \phi, \gamma, \delta, \lambda) = \quad [17]$$
$$\sum_{n=1}^{N}\sum_{m=1}^{M}\sum_{k=1}^{K} g_{nmk}[\cos\gamma\cos\theta\cos(\phi - \alpha_n) + \sin\gamma\exp(j\delta)\sin(\phi - \alpha_n)] \times$$

-continued $$\exp\left[j\frac{2\pi}{\lambda}[R_m\sin\theta\cos(\phi-\alpha_n)+z_k\cos\theta]\right]+$$

$$\cos\gamma\sin\theta\sum_{n=1}^{N}\sum_{m=1}^{M}\sum_{k=1}^{K}h_{nmk}\exp\left[j\frac{2\pi}{\lambda}[R_m\sin\theta\cos(\phi-\alpha_n)+z_k\cos\theta]\right],$$

where $\alpha_n$ represents the N discrete values of the position angle, $\alpha$, $R_m$ represents the M values of the position variable, R, and $z_k$ represents the K values of the position along the principal axis 103.

Determination of Weights

The weights of the dipoles are then determined from the original voltage data empirically acquired. The complex voltage data are presumed to have been acquired over the field of view, and vary with the angles-of-arrival, $\theta_i$ (i=0, 1, ..., I) and $\phi_j$ (j=0, 1, ..., J), in increments of approximately one to several degrees. The voltage data should also be acquired as functions of the polarization states, $\gamma_c$ and $\delta_d$, of the incoming RF wave, as well as wavelength, $\lambda_f$. An individual datum, $V(\theta_i, \phi_j, \gamma_c, \delta_d, \lambda_f)$, therefore corresponds to one element of a set of I×J×C×D×F equations in the weights $g_{nmk}$ and $h_{nmk}$ given by $$V(\theta_i,\phi_j,\gamma_c,\delta_d,\lambda_f)= \quad [18]$$

$$\sum_{n=1}^{N}\sum_{m=1}^{M}\sum_{k=1}^{K}g_{nmk}[\cos\gamma_c\cos\theta_i\cos(\phi_j-\alpha_n)+\sin\gamma_c\exp(j\delta_d)\sin(\phi_j-\alpha_n)$$

$$]\times\exp\left[j\frac{2\pi}{\lambda_f}[R_m\sin\theta_i\cos(\phi_j-\alpha_n)+z_k\cos\theta_i]\right]+\cos\gamma_c\sin\theta_i$$

$$\sum_{n=1}^{N}\sum_{m=1}^{M}\sum_{k=1}^{K}h_{nmk}\exp\left[j\frac{2\pi}{\lambda_f}[R_m\sin\theta_i\cos(\phi_j-\alpha_n)+z_k\cos\theta_i]\right].$$

Letting the set of observations $(\theta_i, \phi_j, \gamma_c, \delta_d, \lambda_f)$ be collectively represented by $\Theta_\mu$ and the triplet $(\alpha_n, R_m, z_k)$ with a single index variable, $\beta_\nu$, Equation 18 may now be written as $$V(\Theta_\mu)=\sum_{\nu=1}^{N\cdot M\cdot K}G_\nu\Xi(\Theta_\mu;\beta_\nu)+\sum_{\nu=1}^{N\cdot M\cdot K}H_\nu\Psi(\Theta_\mu;\beta_\nu), \quad [19]$$

where $$\Xi(\Theta_\mu;\beta_\nu)=\{\cos\gamma_c\cos\theta_i\cos(\phi_j-\alpha_n)+\sin\gamma_c\exp(j\delta_d)\sin(\phi_j-\alpha_n)\}\times \quad [20]$$

$$\exp\left[j\frac{2\pi}{\lambda_f}[R_m\sin\theta_i\cos(\phi_j-\alpha_n)+z_k\cos\theta_i]\right]$$

and $$\Psi(\Theta_\mu;\beta_\nu)=\cos\gamma_c\sin\theta_i\exp\left[j\frac{2\pi}{\lambda_f}[R_m\sin\theta_i\cos(\phi_j-\alpha_n)+z_k\cos\theta_i]\right]. \quad [21]$$

Using matrix and vector notations, the analytical reference voltage may be expressed as $$V=MW, \quad [22]$$

where $$M=[\Xi\Psi] \quad [23]$$

and $$W^T=[G,H]. \quad [24]$$

The voltage of Equation 22 is then equated to the set of measured complex voltages, $V_{MEAS}$, the number of components being given by the product, U'=I×J×C×D×F. In the special case where the number of measured voltages is equal to the number of weights, the solution is given by $$W^T=M^{-1}V_{MEAS}. \quad [25]$$

In general, the matrix M is a rectangular matrix having a number of rows given by U', and a number of columns given by U''=2N×M×K, where U'≧U''. A psuedo-inverse solution for the weights is obtained using a least-square fit technique as one technique among others commonly applied and obvious to skilled practitioners.

Where the matrix M is singular or near-singular, the weight vector is determined using Singular Value Decomposition (SVD). In accordance with the SVD technique, the singular value decomposition of M begins with the creation of a column-orthogonal matrix P of size U' by U'', a diagonal matrix S (=diag[$s_1, s_2 \ldots s_N$]) of size U'' by U'' with positive or zero elements, and the complex conjugate transpose (indicated by †) of the orthogonal matrix Q (i.e., Q†) of the size U'' by U'', such that $$M=PSQ^\dagger. \quad [26]$$

The next step is to determine a threshold, T, at which $s_t \geq \eta$ where t=1, 2, ..., T. By partitioning the matrices P, S and Q as follows:

$$P=\begin{bmatrix} T & U''-T \\ P_1 & P_2 \end{bmatrix}, \quad [27]$$

$$Q=\begin{bmatrix} T & U''-T \\ Q_1 & Q_2 \end{bmatrix}, \quad [28]$$

and $$S=\begin{bmatrix} S_1 & 0 \\ 0 & S_2 \end{bmatrix}^T_{U''-T} \quad [29]$$

the weight vector is calculated using the following matrix operations:

$$W=(Q_1 S_1^{-1} P_1^\dagger)V_{MEAS}. \quad [30]$$

With the weights of the distribution of infinitesimal dipoles determined, Equation 18 now yields a mathematical expression for the complex voltage as determined by a receiving element of the antenna system. The expression may now be used as a generalized antenna model by which the voltage may be determined for any arbitrary angle-of-arrival within the field of view for which the weights where optimized.

The present invention may also be used as a method for determining the angles-of-arrival where the voltage data have previously been acquired for the frequency of interest. The reference voltages are reconstructed for each antenna element at each increment of the polar angles θ and φ of the field of view. The true direction angles are then determined by minimizing the difference between actual voltage measurements and the references voltages calculated using the present method.

DETAILED DESCRIPTION OF THE PREFERRED EMBODIMENT

Figure 3:
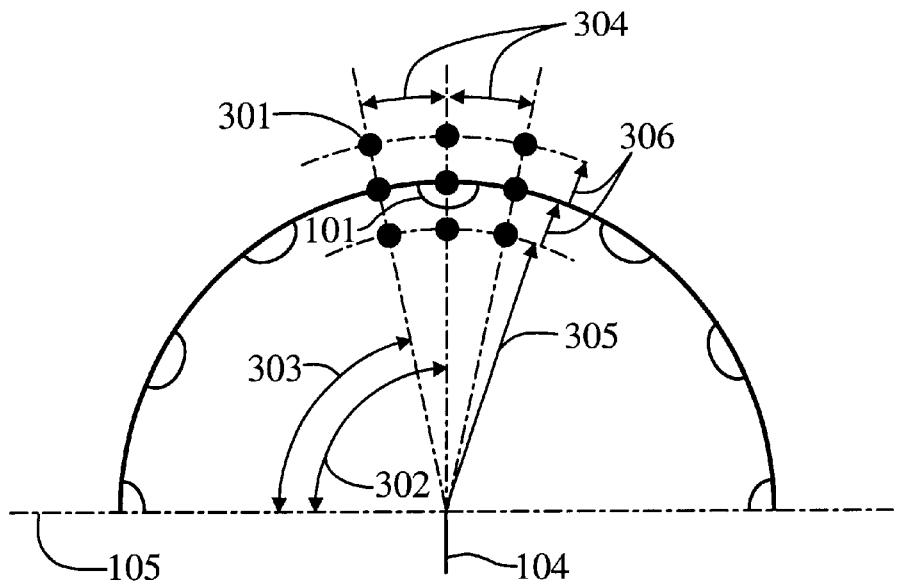
FIG. 3 illustrates a transverse cross section of the distribution of sub-element antennas as superimposed on a transverse cut through the mounting portion of an array of receiving elements with diverse orientations of each elements' respective polarization.

FIG. 3 illustrates the relative orientation of the receiving element and the distribution of sub-element antennas with which it is associated. The view is of the section in the transverse plane of the mounting surface 102 looking down the principal axis 103. The individual receiving element 101 is one of a plurality of sensing elements of the array 111 mounted on a surface of curvature 102. Each receiving element generates a voltage when excited by an electromagnetic signal. Voltage measurements acquired from RF waveforms incident from directions encompassing the field of view are collectively referred to as the voltage data. Each receiving element has associated with it a plurality of sub-element antennas. An individual sub-element antenna 301 is one of a plurality of linear dipoles associated with, and distributed in three dimensions in proximity to, the receiving element 101. The distribution of dipoles is a mathematical construct which collectively models the voltage data as measured by the element 101. In the preferred embodiment, the dipoles are uniformly spaced in each of the dimensions, $\alpha$, R, and z. The angular and radial location of each dipole is given by $$\alpha_n = \left(n - \frac{N+1}{2}\right)\Delta\alpha + \alpha \text{ for } n = 1, 2, \ldots, N \quad [31]$$

$$R_m = \left(m - \frac{M+1}{2}\right)\Delta R + R \text{ for } m = 1, 2, \ldots, M \quad [32]$$

where the angle $\alpha_n$ 303 is a combination of the incremental angle 304, $\Delta\alpha$, separating adjacent dipoles and the reference angle 302, $\alpha$. The radius $R_m$ 305 is a combination of the incremental radius 306, $\Delta R$, and the reference radius, R.

Figure 4:
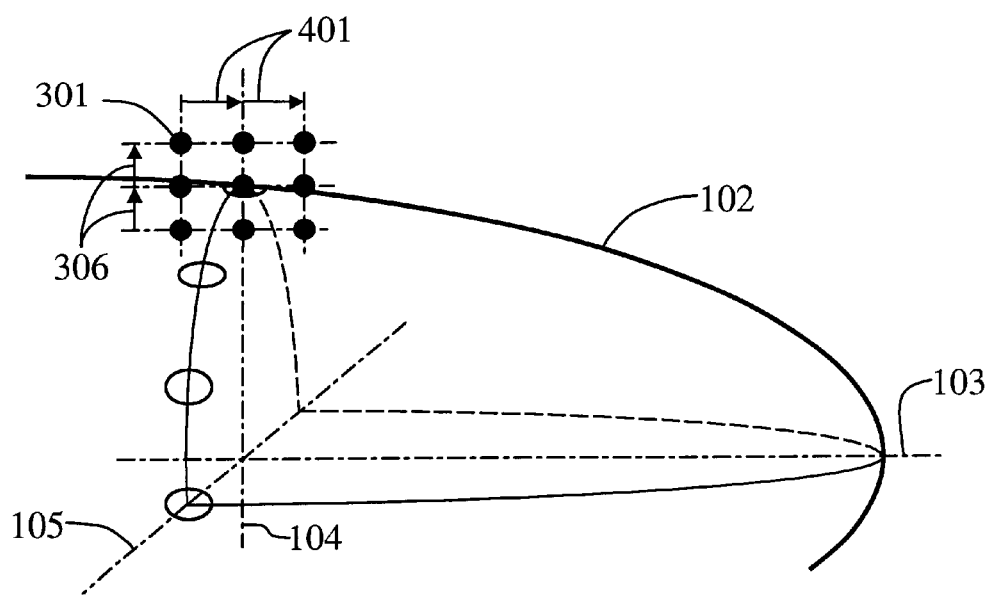
FIG. 4 illustrates a longitudinal cross section of the distribution of sub-element antennas as superimposed on a longitudinal cross section of the array of receiving elements with diverse orientations of each elements' respective polarization.

In FIG. 4, a cross section is shown of the mounting surface 102 revealing the placement of the dipoles in the longitudinal plane containing the axis 104. The locations of the dipoles are given by the following relationship:

$$z_k = \left(k - \frac{K+1}{2}\right)\Delta z + z \text{ for } k = 1, 2, \ldots, K, \quad [33]$$

where $\Delta z$ 401 is the axial incremental measurement unit.

Figure 5:
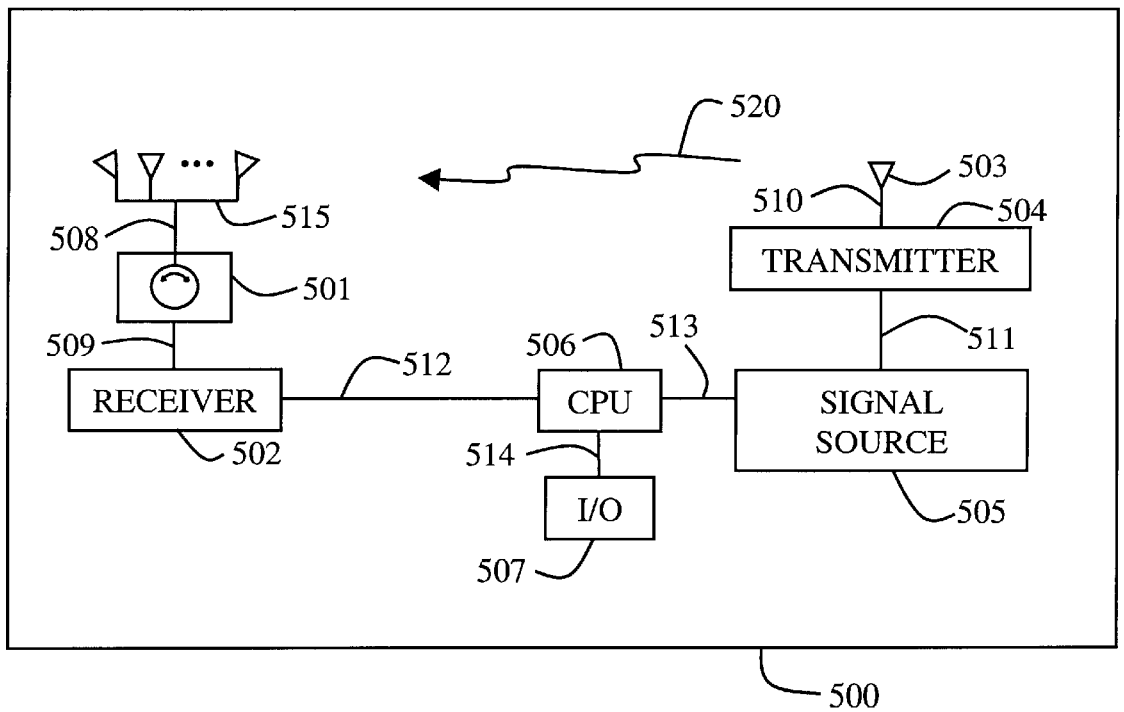
FIG. 5 is a functional block diagram of an anechoic chamber apparatus for acquiring the measured voltage data with which the complex weights are determined according to the present invention.

FIG. 5 illustrates an apparatus for acquiring the measured antenna pattern data for compression with the method of the present invention. The anechoic chamber 500 provides a controlled environment for acquiring measured signals in the absence of background radiation with the antenna array 515, which is a representation of antenna array 111.

The measured signals take the form of voltages. More specifically, the measured signals take the form of complex voltages that are measured for two or more independent orientations of the polarization at each pair of direction angles and one or more frequencies. The acquisition of the antenna pattern data necessarily precedes the modeling of the voltage data, and may be acquired separate from, and in advance of, the implementation of the steps of the present invention.

Figure 1:
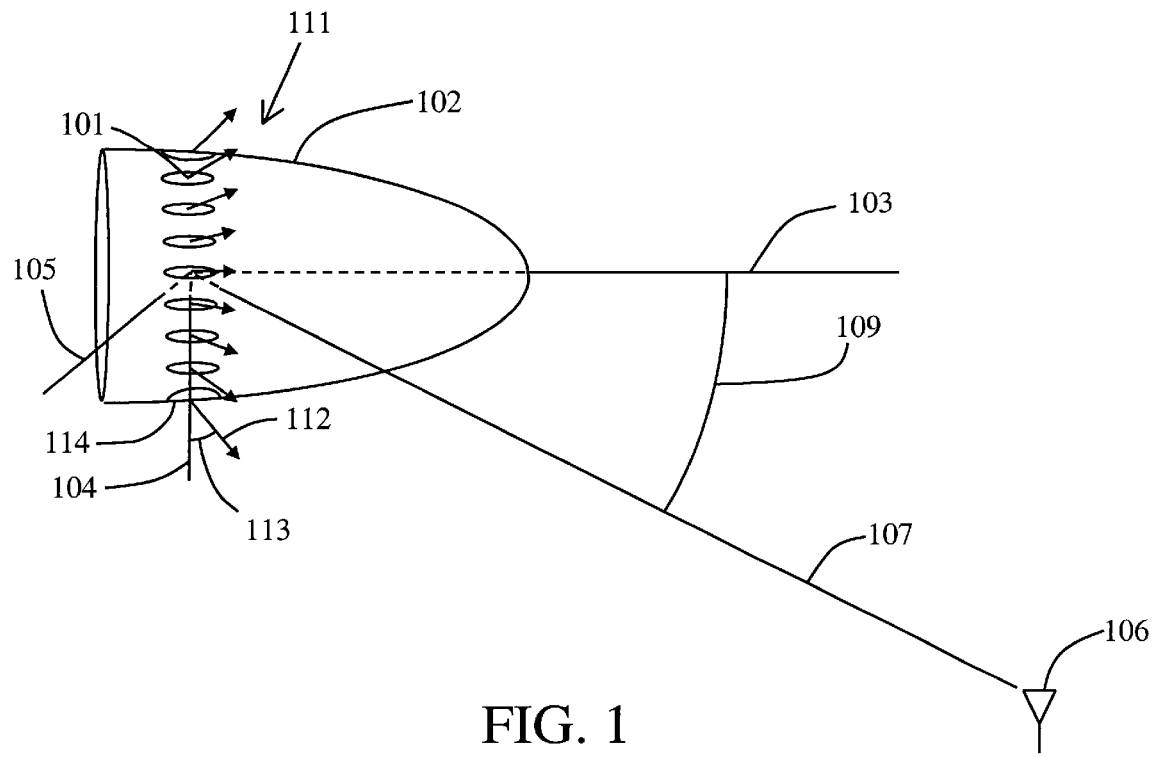
FIG. 1 illustrates the orientation and mounting of a RF antenna element array with diverse orientations of each elements' respective polarization with angles-of-arrival to a source of RF emissions used to explain the present invention.
Figure 2:
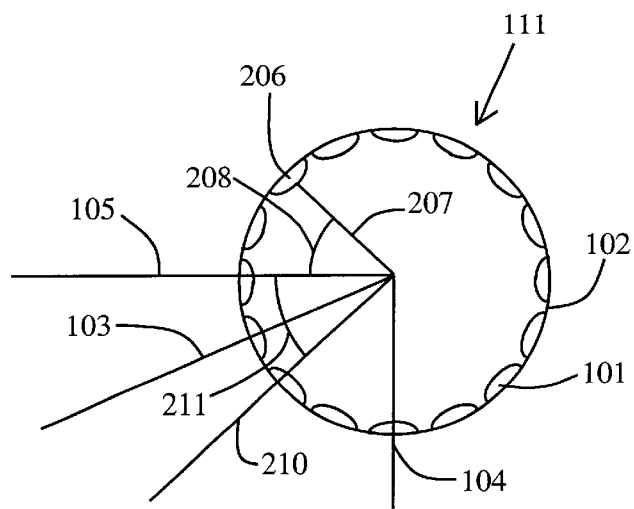
FIG. 2 illustrates a transverse cross section of the mounting portion of a RF antenna element array of diverse orientations of each antenna elements' respective polarization used to explain the present invention.

The antenna array 515 is oriented relative to the transmitter 503 using the articulated joint structure 501; a joint capable of movement with two degrees of freedom. The processor 506 regulates the frequency and form of the signal generated with the signal source 505 and transmitter 504. The RF waveform transmitted via the antenna 503 is received by the array 515 under conditions that reflect practical implementations of the array 111 of FIGS. 1 and 2. The processor 506 also controls the orientation of the array 515 which may be positioned finely relative to the transmitter 503 to acquire finely sampled voltage data over a range of orientations corresponding to the field of view of the array 111.

The antenna array 515 should replicate as closely as possible the physical and electrical properties of the antenna array 111 with which direction-finding will be performed. The antenna pattern data must therefore be collected under conditions that accurately reproduce the physical surroundings of the antenna element 101, the reflective and refractive qualities of the mounting surface 102, and the shadowing of the mounting surface 102 and missile that all give rise to significant deviations in the amplitude and phase from an ideal antenna array in free space.

At each particular orientation of the array 515 and frequency of the transmitted waveform, a measured voltage is taken in at receiver 502 and recorded. Each voltage datum is an estimate of the observational measurement one would expect to detect if the array 111 were irradiated with an RF waveform of like polarization and frequency by an emitter having the same relative orientation to the array 111 as array 515 has to the transmitter 503. The voltage data are characterized by an amplitude and phase, and include the effects of the structure on which the receiving element is mounted as well as any mutual interaction between the elements of array 111. For the complex weights to portray voltage data, the voltage data must necessarily manifest the perceptible differences between the voltage data acquired, for example, with a conductive radome and dielectric radome. Preferably, the voltage data are acquired with a high signal-to-noise ratio.

The voltage data are acquired as a multivariable function of the direction angles and frequency across the entire field of view over which the antenna array is designed to be responsive. For each discrete pair of direction angles, the antenna array 515 is subjected to RF radiation with a predetermined polarization and frequency. The final voltage data are a sampling of the voltage over the entire field of view in increments sufficiently fine to satisfy the accuracy requirements of the application. In the preferred embodiment, the antenna pattern data are acquired over the polar and azimuth angles in two-degree increments over the 2 π solid angle in the forward direction of the array 111. Where practicable, one may further model the voltage data over a predetermined bandwidth by sampling the voltage data at discrete frequencies for the requisite bandwidth. The voltage pattern of an elliptically polarized wave may be modeled provided that two orthogonal orientations of the polarization of the incident wave are acquired as well as the angles γ and δ. The measured voltage data are then made available in a computer readable medium for further processing by means of the input/output device 507.

Figure 6:
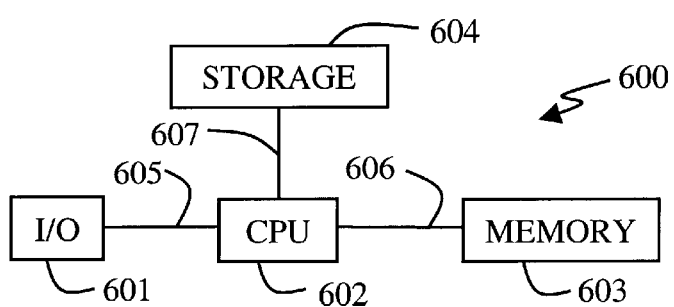
FIG. 6 is a block diagram of a general purpose computing system in which the present invention may be implemented.

Illustrated in FIG. 6 is a general purpose computing system 600 for processing the voltage data according to the method of the present invention. The central processing unit, CPU, 602 provides the main processing functionality. The CPU 602 is coupled to memory 603 comprised of random access memory or read only memory or the equivalent, and to storage 604 comprising a non-volatile memory, for example, disk storage. The memories 603 and 604 comprise computer readable media for the storage of computer readable program code and data including the antenna pattern data. User input and output are provided by the input/output device, I/O, 607 which may include, for example, a graphical display, a keyboard, and multiple drives.

Figure 7:
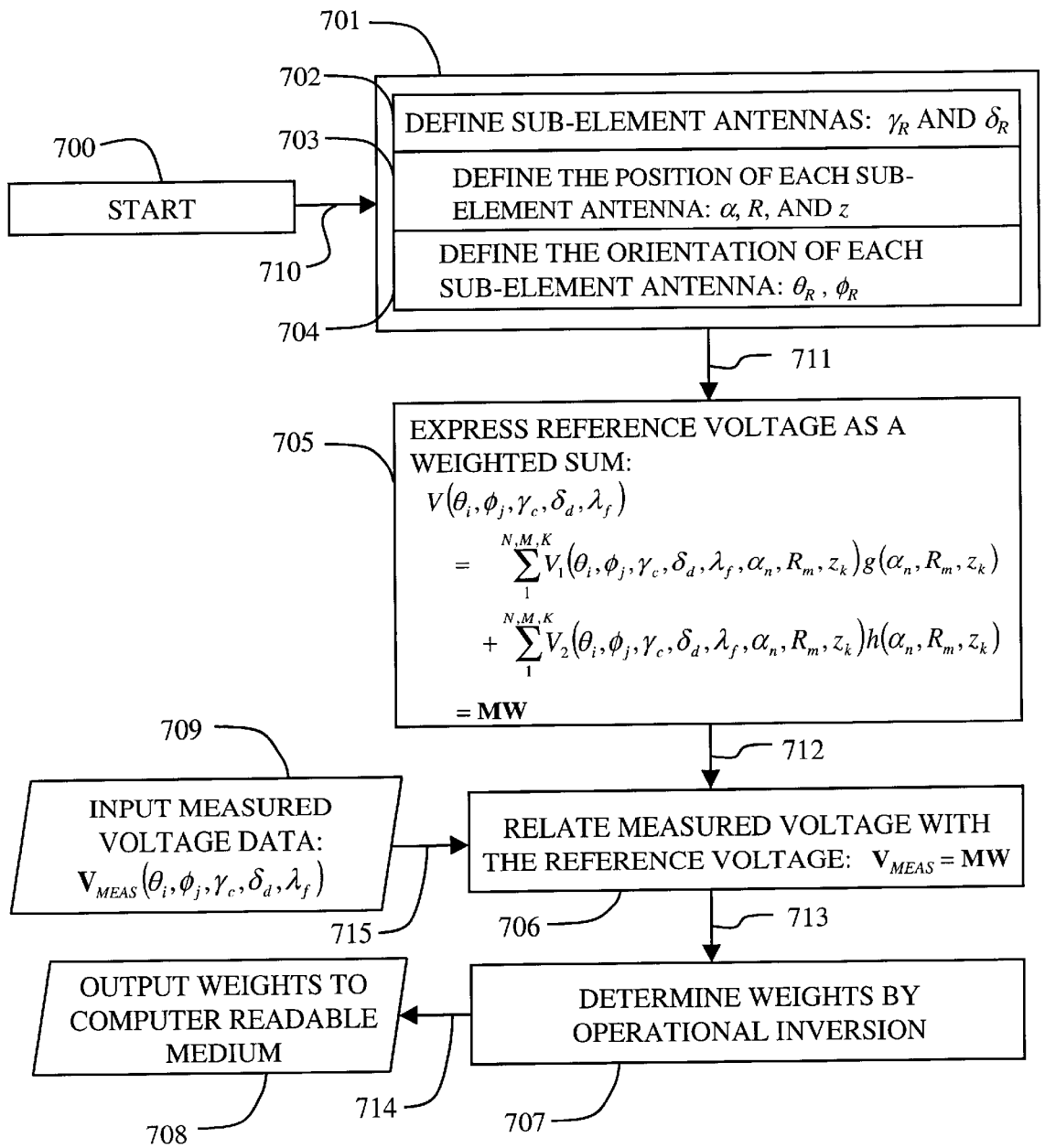
FIG. 7 is a flow chart of a process according to the present invention for determining the complex weights which, in cooperation with a distribution of sub-element antennas, permit the antenna pattern data to be efficiently represented in compressed form.

Illustrated in FIG. 7 is a detailed flowchart of the method of the present invention for determining the complex weights of the representative sub-element antennas used in representing the antenna pattern data. The antenna pattern data are represented by the complex voltage data provided as input 709. The voltage data are modeled by a distribution of "sub-element antennas" that are completely operator defined 701. The term "sub-element antenna" refers to an idealized mathematical model of an antenna of infinitesimal dimension. The sub-element necessarily includes the linear dipole but is defined broadly to include antennas which are mathematically attainable but beyond the reach of physically realizability or practical implementation.

The number and character of sub-element antennas for modeling the voltage data are selected 702. Each sub-element antenna for example may be elliptically polarized, its polarization properties being defined in terms of $\gamma_R$ and $\delta_R$. In the preferred embodiment, the sub-element antenna selected in 702 is an infinitesimal linear dipole. In the case of the infinitesimal linear dipole, upon which the above representation of the voltage is derived, $\gamma_R=\pi$ and $\delta_R=0$. The sub-element antenna selected 702 need not necessarily be of the same polarization as the receiving antenna 101 of the array 515 with which the voltage data were acquired 709. Although some advantage may be realized by using an antenna model having a polarization substantially identical to the physical antenna from which the voltage data were acquired, there is no empirical evidence from the preferred embodiment establishing a preference with regard to the polarization of the antenna model.

In the preferred embodiment, the number of sub-element antennas is given as the product, N×M×K, but varies depending on the angular range of the voltage data as well as the frequency over which the complex weights are modeled. In theory, there are no constraints upon the number of sub-element antennas or the values that the position and orientation variables may assume. It was, however, empirically determined that the number and position of the sub-element antennas has an appreciable effect on the precision to which the distribution of sub-element antennas represent (i.e., "fit") the voltage data. The total number of sub-element antennas largely governs the quality of the fit, and must exceed a subjectively determined threshold. In the preferred embodiment, a satisfactory representation of the voltage data was acquired for a single frequency for $0 \leq \theta < \pi/2$ and $0 \leq \phi < 2\pi$ with nine sub-element antennas distributed in the plane transverse to the principal axis 103. Although the accuracy of the fit of the voltage data increases as the number of sub-element antennas increases, a point of diminishing returns is approached where the noise, being a component of the measured voltage data 709, is modeled in addition to the signal; signal being the noiseless component of the voltage data. In the signal plus noise situation, the applicability of the modeled voltage data of higher accuracy to practical implementations is reduced.

Continuing with the detailed flowchart in FIG. 7, a spatial distribution of sub-element antennas is generated 703 from the individual sub-element antennas previously defined 702. Each of the sub-element antennas is preferably assigned a unique position defined in cylindrical coordinates by the variables α, R, and z; creating a distribution of linear dipoles located along each of the three orthogonal axes. It is preferable that the sub-element antennas are uniformly and symmetrically situated about the position of the phase center of the receiving element 101.

To a significant degree, the quality with which the original antenna pattern data may be represented by a plurality of complex weights is determined by the placement of the sub-element antennas and the angular extremes to which they range. For example, in the preferred embodiment, it was found that a qualitatively superior fit of the voltage data was attained when the maximal angle over which the sub-element antennas were distributed was equivalent to the angle spanned by three consecutive receiving elements, $2(\alpha_{i+1}-\alpha_i)$. This results in a distribution of sub-element antennas that includes dipoles with the same angular position as the receiving elements on either side of a given receiving element. Such a distribution accounts for any coupling between adjacent receiving antennas. In the preferred embodiment, it was also determined that K=1 was sufficient to practically represent voltage data collected for small angles-of-arrival.

In addition to the positional degrees of freedom, each of the sub-element antennas must be initialized with a given orientation 704, namely, $\theta_R$ and $\phi_R$. Preferably, each of the sub-element antennas of the distribution is assigned a polarization orientation approximating the orientation of the original receiving element 101, that is $\phi_R=0$. In the preferred embodiment, the orientation of the polarization of each of the dipole antennas of the distribution defined 702 is radially oriented in the plane transverse to the principal axis 103.

Referring still to FIG. 7, a reference voltage is generated 705 from the weighted sum of the voltages of the distribution of sub-element antennas. The voltage expression for each individual sub-element is an idealized voltage expressed as a function of the polarization, position, and orientation of the sub-element when irradiated by an idealized waveform. The terms $g(\alpha_n, R_m, z_k)$ and $h(\alpha_n, R_m, z_k)$ represent the hitherto unknown complex multipliers or weights by which the distribution of sub-element antennas are weighted so as to accurately reproduce the voltage pattern as detected by a receiving element 101. Generally, the number of weights is given by the number of sub-element antennas with which the receiving element is represented. In the preferred embodiment, the weight is optimized over the positional degrees of freedom, namely α, R, and z, and the tilt angle, τ. In the particular representation of Equation 13, the expression of the voltage of the linear dipole may be viewed as a form basis set about which the functional dependence of the voltage data are expanded. By redefining two new weighting functions in Equations 14 and 15, two new basis sets given by the weighted volume integrals of Equation 16 are created. While the principal effect of this redefinition is to double the number of complex weights which must be determined, the act of integrating the tilt angle τ in Equations 14 and 15 yields a beneficial expression for the voltage in Equation 16 by which the tilt angle is optimized over all possible angles. The reference voltage expression 705 in FIG. 7 is merely a restatement in discrete form of the voltage expressed in Equation 16 where the weights g(α, R, z) and h(α, R, z) are analogous to g($\alpha_n$, $R_m$, $z_k$) and h($\alpha_n$, $R_m$, $z_k$), respectively.

In theory one could also weight the voltages according to the other degrees of freedom including the antenna polarization angles, $\theta_R$ and $\phi_R$. Although greater accuracy may be achieved in this manner, with each new weight there is a corresponding increase in the amount of computer storage memory necessary for the idealized representation of the voltage patterns. Any such tradeoff must be made in light of the demands of the application and the degree of compression required.

The measured voltage data and reference voltage are related 706 in terms of the unknown complex weights. The relationship, $V_{MEAS}$=MW, is expressed using vector and matrix notation which compactly represents a system of linear equations from which the weights are derived. This system of equations is developed by relating the expression for the reference voltage at a particular point in the observation space with an individual voltage datum measured at the corresponding angles-of-arrival for a waveform of corresponding polarization and frequency. The observation space refers to the number of independent variables for which measured voltage data are acquired and the range over which they are sampled. The observation space in the preferred embodiment is a five dimensional space comprised of the two direction angles, two polarization angles, and frequency.

The next step is the process of pseudo-inversion 707 in which the weights are uniquely determined for each of the sub-element antennas of the distribution. In the preferred embodiment, the length of the weight vector W is equal to 2N×M×K, while M is given by I×J×C×D×F rows and 2N×M×K columns. In general, this is a rectangular matrix but is square on the condition that the number of measured voltages is equal to the number of weights. The inversion or least-squares fit of M is described in detail above.

Voltage Data Based on Orthogonal Polarization Orientations

The method described in FIG. 7 is generalized to represent the high degree of versatility of the antenna data compression method of the present invention. The method is flexible and has the capability of generating the complex weights based upon non-orthogonally polarized voltage data 709. In practice, it may be desirable to restrict the voltage data to two orthogonal orientations of the polarization. One example of data restriction is by acquiring two sets of measured voltage data; a first set of data corresponding to γ=0 and δ=0, and a second set for γ=π/2 and δ=0. The first data set corresponds to a "horizontal polarization" state and the second set to a "vertical polarization," each term defined in a coordinate system fixed with respect to the array 111.

Restricting the polarization of the voltage data affords an advantage with respect to memory space allocation, reconstruction time, and accuracy. The 5-dimensional observation space (including two direction angles, two polarization angles and frequency) represented by the antenna pattern data 709 is reduced to two independent data sets, each a function of a 3-dimensional observation space (including two direction angles and frequency). The independent measurements at the two polarization states result in two voltage expressions 705, each being a function of individual and hitherto unknown weights. The weights in turn are determined by operational inversion 707. After the sets of weights are determined, an estimate of the original antenna pattern data is obtained for any polarization by combining the two reconstructed complex voltages with the given polarization angles.

Complex Weights Using Subspace Analysis

Figure 8:
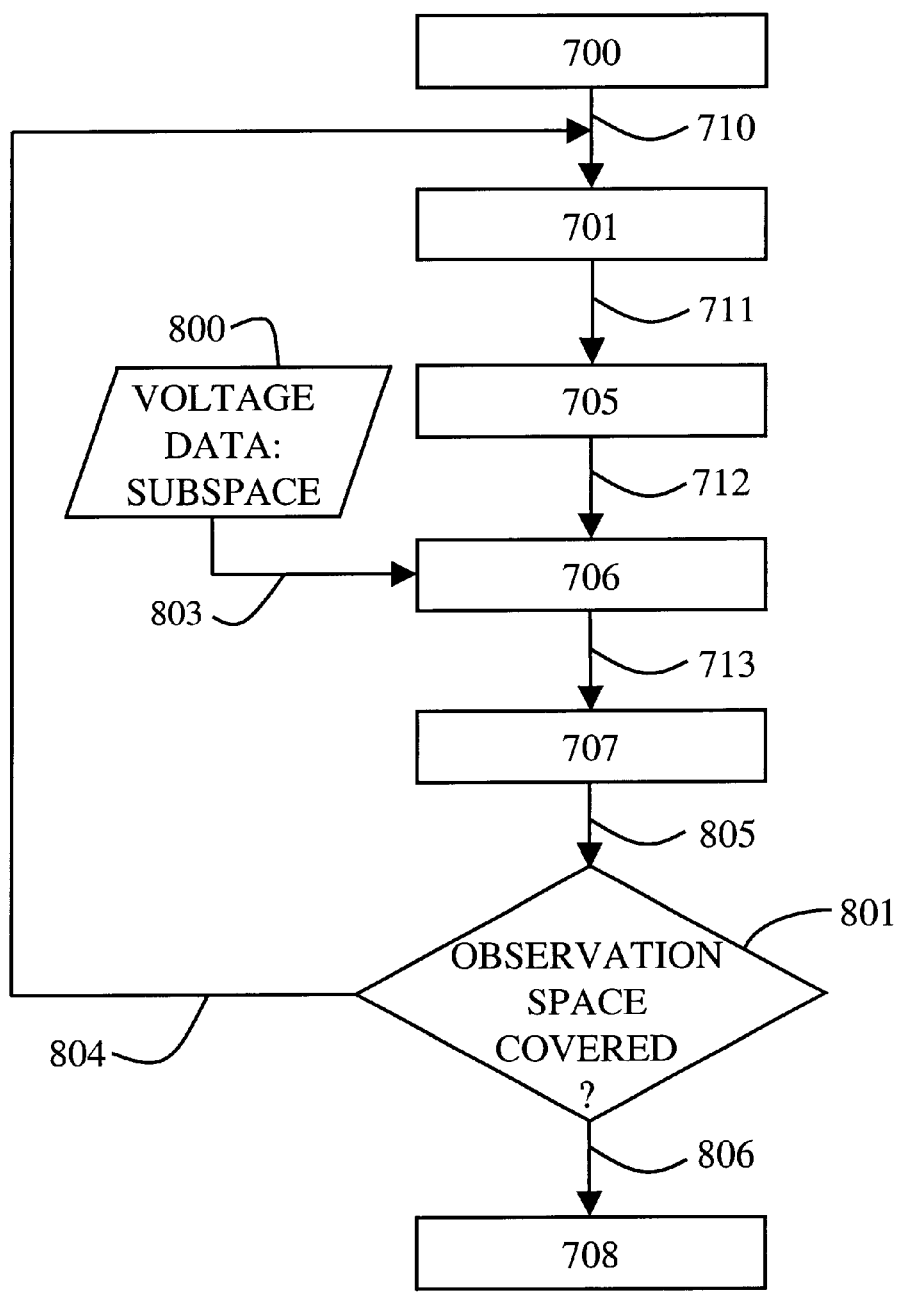
FIG. 8 is a flow chart of a process according to the present invention for determining two or more sets of complex weights, each set corresponding to a subsection of the observation space.

Referring to FIG. 8, the method of the present invention is adapted to generate multiple sets of complex weights for representing limited portions of the observation space spanning the direction angles and frequency. In general, the number of complex weights needed to properly model the measured voltage data acquired over the requisite angles-of-arrival and bandwidth may be unacceptably large. One skilled in the art will recognize that savings may be realized in computer storage memory and compression/decompression processing time by partitioning the entire observation into a series of contiguous subspaces where each subspace is associated with a unique set of complex weights. The entire observation space is then modeled in a piecemeal fashion.

The difference between the methods of FIGS. 7 and 8 is illustrated in FIG. 8. The reference voltage 705, in terms of the complex weights, is related 706 to the measured voltage data corresponding to a limited subspace 800. The subspace is a subset of the entire observation space represented by the measured voltage data 709 of FIG. 7. In the method illustrated in FIG. 8, a unique set of equations is generated 706 for each subset 800 of measured voltage data. The corresponding complex weights generated 707 are therefore optimized for the subspace 800 rather than the entire observation space of the measured voltage data input step 709. Preferably, the observation space is subdivided into a plurality of regions spanning the data in θ and frequency where φ ranges between zero and 2π (or other maximum value). With the measured voltage data 800 limited to a particular region of the larger observation space, one may represent the voltage data in this local region with a minimum of complex weights.

The process of solving for the complex weights 707 is repeated for each of the subspaces 800 until sets of complex weights are determined for the entire observation space. Each set of complex weights corresponds to a select region of the observation space, the entire observation being represented piecemeal. Until the observation space is traversed, decision block 801 is answered in the negative and the processes of generating a distribution of sub-element antennas 701 (characterized by given polarization angles, position, and orientations) is repeated. After having applied the method of the present invention to the entire observation space represented by measured voltage data 709, the process of FIG. 8 proceeds to report in the output 708 the two or more sets of complex weights in a computer readable medium.

The method illustrated in FIG. 8 has application where the compression ratio is improved, i.e., where the total number of complex weights necessary to represent the plurality of subspaces is less than that needed to represent the entire observation space simultaneously.

Figure 9:
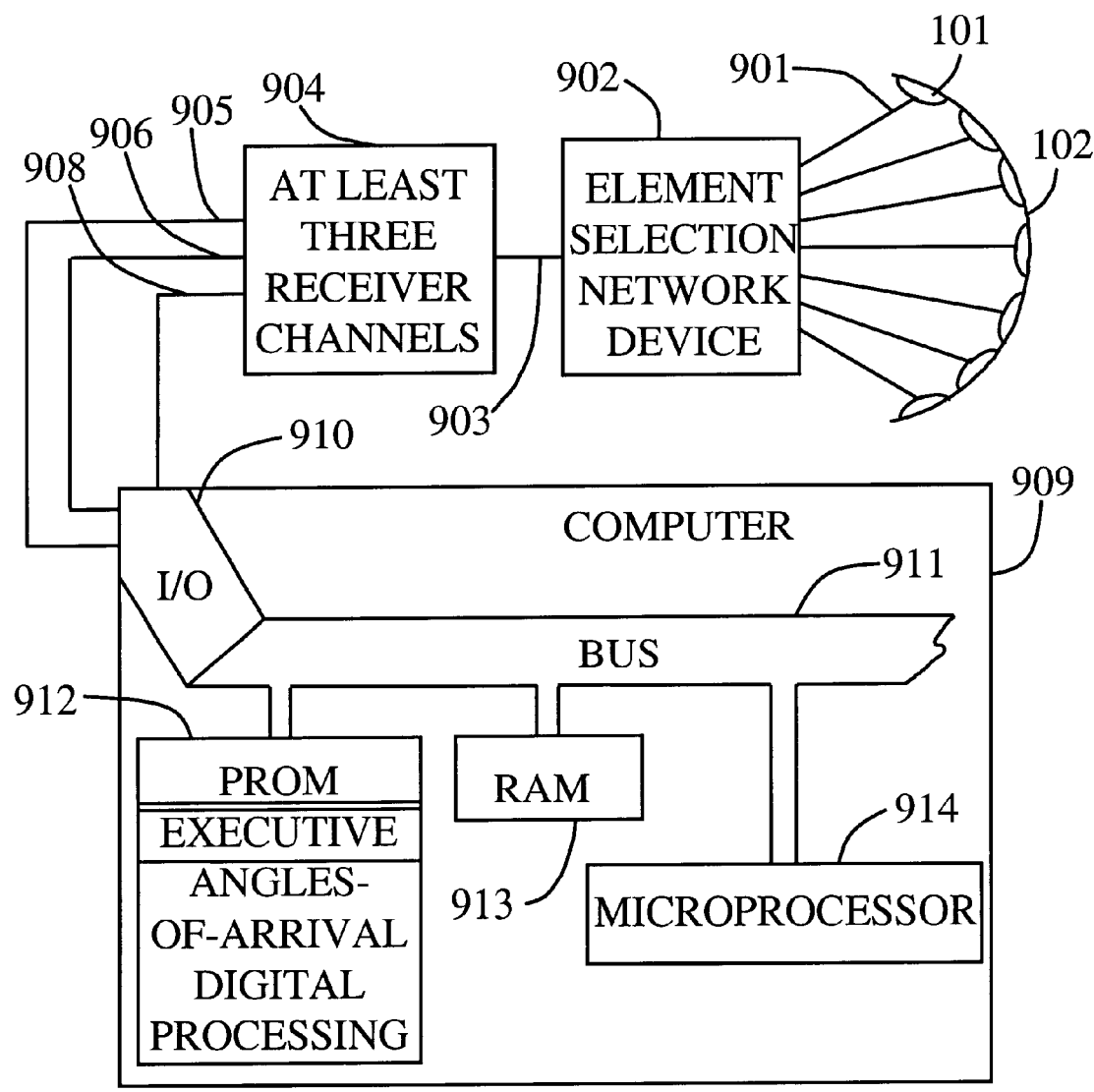
FIG. 9 is a block diagram of a direction-finding system in which the present invention can be implemented.

FIG. 9 illustrates a block diagram of an apparatus within which the complex weights developed with the present invention are stored and the antenna pattern data decompressed. The decompressed antenna pattern data, in the form of complex voltage data, serve as a reference voltage in a direction-finding algorithm. Individual RF sensing elements, 101, are mounted on a surface of curvature 102. Each element is connected to an element selection network 902 by an electrically conductive line 901. Each antenna element generates a voltage when excited by a RF waveform. The element selection network selects pairs of antenna elements for the application of interferometry. The resulting sensing antennas' produced voltages are conveyed along a conductive harness 903 to a RF receiver 904. With a receiver channel for each signal, the receiver outputs a phase difference 905 for each particular signal pair and for each signal the receiver outputs a measure of voltage 908 or a measure of signal power from which the square root can later be taken. Additionally, the receiver will output a measure of frequency of the RF signal 906. The phase differences 905, powers 908, and frequency 906 of the RF signal are input signals to the input/output interface 910 of a special computer generally designated 909. Within the programmable, read-only memory 912 of the computer, there is stored executive software for regulating communication with hardware components, the compressed voltage data in the form of complex weights, and executing software for angles-of-arrival digital processing including processing means for decompressing the antenna pattern data. Additionally, this software and antenna pattern data may be stored in random access memory 913, when the apparatus begins operation and the angles-of-arrival processing is conducted within the microprocessor 914.

Although the description above contains many specifications, these should not be construed as limiting the scope of the invention but as merely providing illustrations of some of the presently preferred embodiments of this invention.

Therefore, the invention has been disclosed by way of example and not limitation, and reference should be made to the following claims to determine the scope of the present invention.

We claim:

1. A method for efficiently compressing antenna pattern data, the antenna pattern data being a set of measured voltage data functionally dependent on angles-of-arrival; the method comprising the steps of:

(a) characterizing one or more sub-element antennas where each sub-element antenna is assigned an initial polarization, a unique position, and an orientation with respect to a fixed coordinate system;

(b) characterizing an idealized voltage expression for each of the one or more sub-element antennas; each idealized voltage expression being a function of a direction, polarization, and wavelength of an idealized waveform;

(c) mutiplying each of the one or more idealized voltage expressions of step 1(b) by a weight variable of undetermined value;

(d) expressing a reference voltage as a linear combination of the one or more idealized voltage expressions as weighted in step 1(c);

(e) relating the antenna pattern data with the reference voltage of 1(d) to produce a relationship whereby the idealized voltage expressions for the one or more sub-element antennas are related to the measured voltage data as a function of the angles-of-arrival; and (f) solving for the values of the weight variables of step 1(c) by operational inversion of the relationship of step 1(e);

whereby the antenna pattern data may be represented in compressed form by the values of the weight variables.

2. The method of claim 1 wherein each of the one or more sub-element antennas is an infinitesimal linear dipole.

3. The method of claim 2 wherein the antenna pattern data represent the interaction between a receiving element and a RF waveform with a characterizable wavelength.

4. The method of claim 2 wherein the antenna pattern data represent the interaction between the receiving element and a plurality of RF waveforms, the RF waveforms representing a range of different and substantially known characterizable wavelengths.

5. The method of claim 3 wherein the values of the weight variables are determined for a subspace of an observation space associated with the angles-of-arrival.

6. The method of claim 5 wherein the one or more sub-element antennas have an initial polarization substantially identical to the receiving element.

7. The method of claim 6 wherein the receiving element is one of a plurality of receiving elements comprising an array where the plurality of receiving elements possessing polarization diversity.

8. A method for compressing voltage data measured with a receiving element for sensing incoming RF emissions; the voltage data determined for a plurality of RF signals having known direction, polarization, and wavelength; the method comprising the steps of:

(a) defining a plurality of dipole antennas associated with the receiving element; each of the dipole antennas having a known position and orientation determined by varying one or more degrees of freedom associated with a position and orientation of the receiving element;

(b) generating idealized voltage expressions representing the interaction of each of the plurality of dipole antennas and an idealized signal; said idealized signal being a function of direction, polarization, and wavelength; the idealized voltage expression having the form $$v(\alpha) = [A\cos(\phi - \phi_R - \alpha) + B\sin(\phi - \phi_R - \alpha) + Z] \times$$
$$\exp\left[-j\frac{2\pi R}{\lambda}(\sin\theta\cos(\phi - \alpha)) + z\cos(\theta)\right]$$

where
A=cos γ cos θ cos τ;
B=sin γ cos τ$e^{j\delta}$; and
Z=cos γ sin θ sin τ;

(c) multiplying each of the plurality of idealized voltage expressions of step 8(b) by a complex weight of undetermined value given by $$w=w(\alpha, R, z, \tau)$$

whereby a weighted linear dipole antenna array is expressed;

(d) expressing a reference voltage as a superposition of the plurality of idealized voltage expressions weighted in step 8(c); the reference voltage having the form $$V(\theta, \phi, \gamma, \delta, \lambda) = \int\int\int g(\alpha, R, z)[\cos\gamma\cos\theta\cos(\phi - \phi_R - \alpha) +$$

$$\sin\gamma\exp(j\delta)\sin(\phi - \phi_R - \alpha)] \times$$

$$\exp\left[j\frac{2\pi}{\lambda}[R\sin\theta\cos(\phi - \phi_R - \alpha) + z\cos\theta]\right] d\alpha dR dz +$$

$$\cos\gamma\sin\theta\int\int\int h(\alpha, R, z)$$

$$\exp\left[j\frac{2\pi}{\lambda}[R\sin\theta\cos(\phi - \phi_R - \alpha) + z\cos\theta]\right] d\alpha dR dz$$

where $g(\alpha, R, z) = \int w(\alpha, R, z, \tau)\cos\tau d\tau,$ $h(\alpha, R, z) = \int w(\alpha, R, z, \tau)\sin\tau d\tau;$ (e) relating the voltage data with the reference voltage;

(f) solving for the values of the complex weights of step 8(c) by operational inversion of the expression of step 8(d) in terms of the voltage data; and (g) using the values of the complex weights to represent the voltage data.

9. The method of claim 8 wherein one of the plurality of dipole antennas is made to coincide with the receiving element in a common coordinate system.

10. The method of claim 9 wherein the plurality of RF signals has one or more substantially known characterizable wavelengths.

11. The method of claim 10 wherein the plurality of dipole antennas is uniformly separated, with respect to the degrees of freedom associated with the position, by a distance that is small in comparison to the longest characterizable wavelength.

12. The method of claim 11 wherein the voltage data represent the interaction of the receiving element with RF signals having two or more independent polarization orientations.

13. A method for efficiently compressing measured voltage data representing antenna pattern data, the method comprising the steps of:

(a) defining one or more sub-element antennas, each sub-element antenna being characterized by a position, an orientation, and two polarization angles;

(b) generating sub-element voltage expressions representing the interaction of each of the sub-element antennas of step 13(a) with an idealized waveform; each of the idealized voltage expressions being a function of an idealized waveform characterized by direction angles, polarization angles, and wavelength;

(c) mutiplying each sub-element voltage expression of step 13(b) by a complex weight of undetermined value;

(d) generating a reference voltage expression, the reference voltage expression being a linear combination of a product of the sub-element voltage expressions and complex weights of step 13(c);

(e) determining the values of the complex weights of step 13(c) by operational inversion of the reference voltage expression of step 13(d); the reference voltage being substantially equivalent to the measured voltage data; and (f) using the values of the complex weights, in addition to the position and orientation of the sub-element antennas, to reconstruct the measured voltage data in a direction-finding system.

14. The method of claim 13 wherein the measured voltage data represent the interaction between RF signals and a receiving element having substantially elliptical polarization.

15. The method of claim 14 wherein the RF signals are of one or more characterizable wavelengths.

16. The method of claim 15 wherein each of the sub-element antennas is a linear dipole.

17. The method of claim 16 wherein the sub-element antennas are uniformly separated, with respect to the position, by a distance that is small in comparison to the characterizable wavelength of maximal length.

18. A method for compressing measured voltage data acquired with a receiving element characterized by a position and orientation; the measured voltage data determined as a function of direction, wavelength, and two orthogonal polarization states of a received waveform; the method comprising the steps of:

(a) defining one or more infinitesimal dipole antennas associated with the receiving element; each of the infinitesimal dipole antennas having a known position and orientation determined by varying one or more degrees of freedom associated with the position and orientation of the receiving element;

(b) generating a first reference voltage in terms of a horizontal polarization orientation of an idealized signal; the first reference voltage being a weighted linear combination representing the interaction of the infinitesimal dipole antennas with the idealized signal; said first reference voltage being a function of the direction and wavelength of the idealized signal; the first reference voltage being given by $$V(\theta, \phi, \gamma = 0, \delta = 0, \lambda) = \sum_{n=1}^{N}\sum_{m=1}^{M}\sum_{k=1}^{K}[g_{nmk}^{H}\cos\theta\cos(\phi - \alpha_n) + h_{nmk}^{H}\sin\theta] \times$$

$$\exp\left[j\frac{2\pi}{\lambda}[R_m\sin\theta\cos(\phi - \alpha_n) + z_k\cos\theta]\right],$$

where $g_{nmk}^{H}$ and $h_{nmk}^{H}$ are complex weights of undetermined value corresponding to the horizontal polarization orientation of the idealized signal; and (c) generating a second reference voltage in terms of a vertical polarization orientation of the idealized signal; the second reference voltage being a weighted linear combination representing the interaction of the infinitesimal dipole antennas with the idealized signal; said second reference voltage being a function of the direction and wavelength of the idealized signal; the second reference voltage being given by $$V(\theta, \phi, \gamma = \pi/2, \delta = 0, \lambda) =$$

$$\sum_{n=1}^{N}\sum_{m=1}^{M}\sum_{k=1}^{K}g_{nmk}^{V}\sin(\phi - \alpha_n)\exp\left[j\frac{2\pi}{\lambda}[R_m\sin\theta\cos(\phi - \alpha_n) + z_k\cos\theta]\right],$$

where $g_{nmk}^{V}$ is a complex weight of undetermined value corresponding to the vertical polarization orientation of the idealized signal;

(d) relating the measured voltage data with the first and second reference voltages;

(e) solving for the values of the complex weights, $g_{nmk}^{H}$, $h_{nmk}^{H}$, and $g_{nmk}^{V}$; and (f) using the values of the complex weights of 18(d) to represent the measured voltage data in compressed form;

whereby the measured voltage data may be reconstructed by the values of the complex weights.

19. A computer program for compressing antenna pattern data, the program being stored on a computer-readable medium, comprising:

(a) a first computer readable program code for inputting antenna pattern data;

(b) a second computer readable program code for causing a computer to generate a reference voltage expression, the reference voltage being a linear combination of one or more sub-element voltages where each sub-element voltage is weighted by a complex variable of undetermined value;

(c) a third computer readable program code for relating the antenna pattern data and the reference voltage; and (d) a fourth computer readable program code for solving for the values of the complex variables.

20. A computer program stored on a computer-readable medium for compressing measured voltage data, the program configuring a computer system upon being read and executed by the computer system to perform the functions of:

(a) inputting the antenna pattern data;

(b) generating a reference voltage expression proportional to a weighted linear combination of sub-element voltage expressions representing a distribution of one or more sub-element antennas, each sub-element voltage expression being weighted by a weight variable of undetermined value;

(c) relating the measured voltage data and the reference voltage expression; and (d) solving for the values of the weight variables; and (e) using the values of the weight variables to represent the antenna pattern data in compressed form.

21. A memory device containing a computer program of instructions for a general purpose computer to model uncompressed antenna pattern data, the memory device so configured causing the general purpose computer to operate in a specific and predefined manner to perform the functions of:

(a) inputting data representative of the uncompressed antenna pattern data;

(b) generating a reference voltage expression proportional to the sum of one or more weighted sub-element voltage expressions where each sub-element voltage expression corresponding to a sub-element antenna; each sub-element antenna being characterized by a polarization, initial position, and initial orientation; each sub-element voltage expression being weighted by a complex variable of undetermined value;

(c) relating the uncompressed antenna pattern data and the reference voltage expression;

(d) solving for values of the complex variables which, together with the polarization, initial position, and initial orientation of the one or sub-element antennas, are used to reconstruct the uncompressed antenna pattern data.

22. A computer system containing a computer program of instructions for a general purpose computer to compress measured voltage data, comprising:

(a) reading means for inputting the measured voltage data;

(b) first processing means for causing a computer to generate a reference voltage expression resulting from a superposition of one or more sub-element antennas, each sub-element antenna being weighted by a weight variable of undetermined value;

(c) second processing means for relating the measured voltage data and the reference voltage;

(d) third processing means for solving for the values of the weight variables; and (e) third processing means for generating a data set comprised of the values of the weight variables, the data set representing the measured voltage data.

* * * * *